United States Patent

Obasih et al.

[11] Patent Number: 5,877,665
[45] Date of Patent: Mar. 2, 1999

[54] THERMALLY PASSIVE MAGNET MOUNTING SYSTEM FOR AN MRI SIGNA PROFILE MAGNET IN MOBILE TRAILER VAN

[75] Inventors: Kemakolam M. Obasih, Brookfield; John F. Yungman, Waukesha; Lawrence H. Golding, Milwaukee, all of Wis.

[73] Assignee: General Electric Company, Milwaukee, Wis.

[21] Appl. No.: 992,233

[22] Filed: Dec. 17, 1997

[51] Int. Cl.[6] .......................................... H01F 1/00
[52] U.S. Cl. .......................... 335/296; 335/302; 335/306; 335/216; 335/209; 296/24.1
[58] Field of Search ................................... 335/296, 302, 335/306, 209, 216; 296/24.1

[56] References Cited

U.S. PATENT DOCUMENTS

| | | | |
|---|---|---|---|
| 4,672,346 | 6/1987 | Miyamoto et al. | 335/296 |
| 5,459,362 | 10/1995 | Dunfield et al. | 310/154 |
| 5,727,353 | 3/1998 | Getz et al. | 52/79.1 |

*Primary Examiner*—Michael L. Gellner
*Assistant Examiner*—Tuyen T. Nguyen
*Attorney, Agent, or Firm*—B. Joan Haushalter; John H. Pilarski

[57] ABSTRACT

In a mobile magnetic resonance imaging van, the challenge is to design a magnet mounting system such that the top and bottom poles of the magnet are within magnet temperature gradient specifications for good image quality. The present invention provides such a mounting system and method for mounting a permanent magnet in a mobile trailer vehicle. Mounting bolts are used to mount the permanent magnet to the floor of the mobile trailer vehicle. Laminate or composite insulating material, preferably stacked Phenolic pads, thermally insulate the permanent magnet from the trailer floor. A second set of stacked insulating material pads thermally insulate the mounting bolts from the permanent magnet.

10 Claims, 5 Drawing Sheets

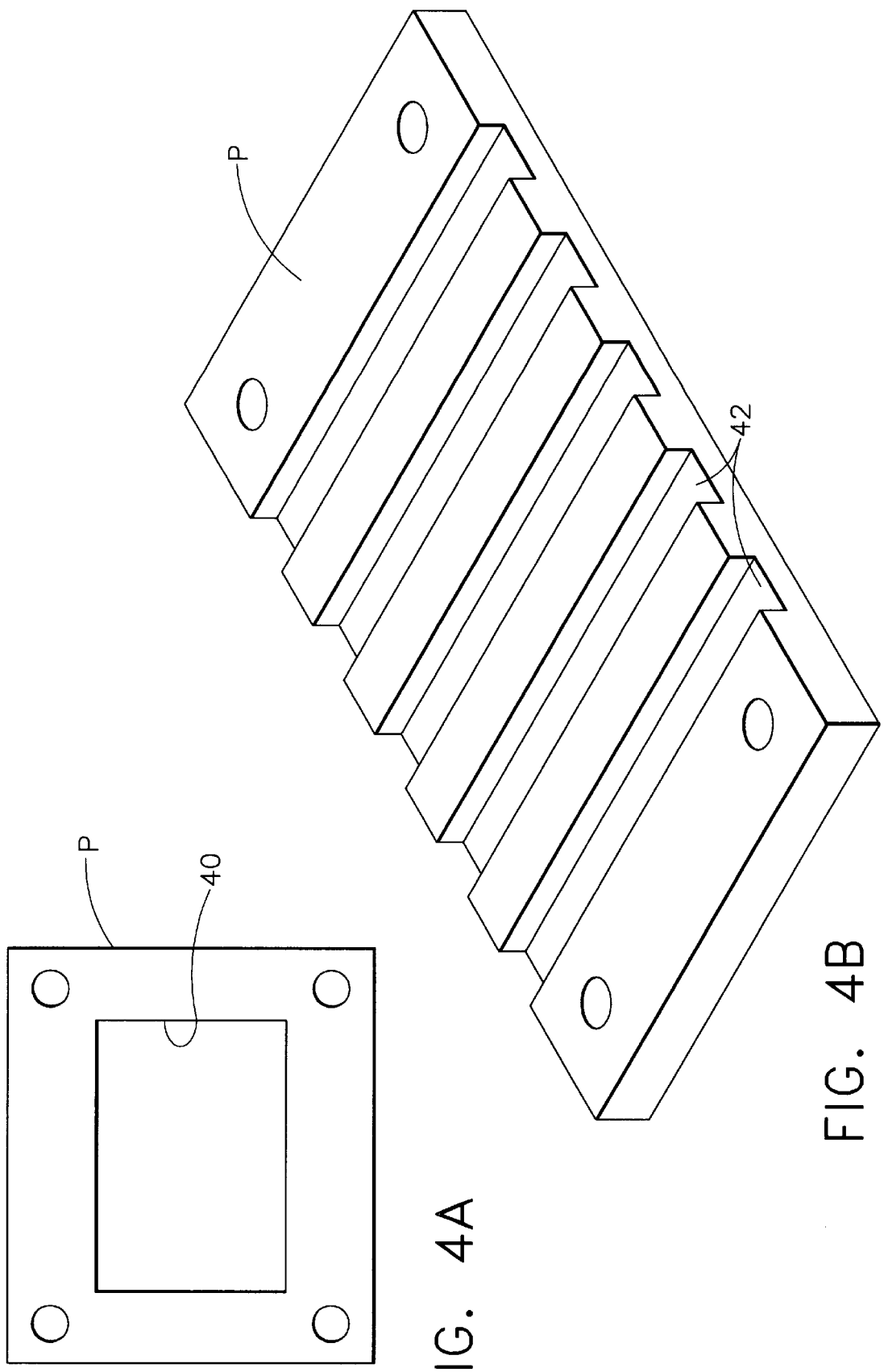

THERMALLY PASSIVE MAGNET MOUNTING SYSTEM FOR AN MRI SIGNA PROFILE MAGNET IN MOBILE TRAILER VAN

TECHNICAL FIELD

The present invention relates to magnetic resonance imaging (MRI) permanent magnets, and, more particularly, to a thermal isolation system for mounting an MRI permanent magnet in a mobile trailer van.

BACKGROUND ART

In the present day cryogen cooled and cryogenless MRI magnets, the magnet solenoid mass is suspended in a cryostat with suspension systems that limit thermal losses. Hence, the magnet cold mass temperature is fairly uniform, or at least within the specified temperature gradient to prevent loss of superconductivity of the coils. Therefore, the magnet feet could be mounted without any special thermal designs.

The main concern in designing the magnet mounts for the permanent magnet class of MRI magnets is to maintain static and dynamic mechanical integrity of the magnet in a mobile van environment. In prior designs for mounting permanent magnets in mobile vans, no special thermal mounting design was applied to provide for thermal stability. The magnet was simply mounted on rubber pads which doubled for thermal insulation and vibration isolation material. The main deficiency of this design is that the rubber is compressible. In a mobile MRI trailer van, the magnet must be properly torqued down to the van floor to be able to withstand dynamic loads during transportation of the van. The bolt torque levels are quite high and introduce large compressive load to the rubber in addition to the magnet weight. The rubber's thermal conductance increases with an increase in pressure. This happens for two reasons, (a) as the rubber is compressed, the thermal resistance length is reduced resulting in higher conductance, and (b) the rubber pad often used is synthetic rubber with high percentage of carbon and as the pad is compressed, these carbon atoms thermally short out increasing the thermal conductance of the pad. Consequently, unacceptable temperature gradients were present between the top and bottom pole of the magnet during extreme temperatures outside the mobile van. When the van outside temperature was about or below −29° C., the magnet heaters were not able to keep the magnet temperature at the required magnet imaging temperature specification. This was true even with the van interior, or magnet room, at the required temperature stratification.

It would be desirable then to be able to develop a thermal isolation system for mounting an MRI permanent magnet in a mobile trailer van, while maintaining mechanical integrity.

SUMMARY OF THE INVENTION

The present invention provides for a thermal and mechanical design for mounting of an MRI permanent magnet in a mobile MRI trailer van. The isolation mounting system of the present invention provides numerous advantages, including thermally insulating the magnet feet from the extreme outside temperatures by forcing large temperature gradients on the insulating material rather than on the magnet itself; thermally insulating the magnet feet mounting bolts from the magnet feet; and providing the required proper mechanical integrity for static and dynamic loading of the magnet.

In accordance with one aspect of the present invention, a thermal isolation system for mounting an MRI permanent magnet in a mobile trailer van comprises means for thermally insulating the magnet feet from the extreme outside temperatures by forcing large temperature gradients on the insulating material rather than on the magnet itself. In a preferred embodiment of the present invention, the thermal isolation system further comprises means for thermally insulating the magnet feet mounting bolts from the magnet feet.

Accordingly, it is an object of the present invention to provide a thermal isolation system for mounting an MRI permanent magnet in a mobile trailer van. It is a further object of the present invention to provide such a thermal isolation system which still allows for maintaining of mechanical integrity.

Other objects and advantages of the invention will be apparent from the following description, the accompanying drawings and the appended claims.

BRIEF DESCRIPTION OF THE DRAWINGS

FIGS. 4A and 4B illustrate a top view and an isometric view, respectively, of alternative embodiments for reducing the effective conduction area of the embodiments of FIGS. 3A and 3B.

DETAILED DESCRIPTION OF THE PREFERRED EMBODIMENTS

The 0.2 T permanent magnet is a dipole magnet with its magnetic field running top to bottom. The magnet's core material magnetic susceptibility is temperature dependent. Thus, a significant temperature stratification in the magnet from top to bottom will result in different magnetization of the top and bottom poles. The temperature and temperature gradient between the top and bottom pole of magnet must be maintained within a certain specification in order to maintain proper magnetic field strength and homogeneity for good MRI image quality.

In a mobile MRI van, the challenge is to design the magnet mounting system such that the top and bottom poles of the magnet are within magnet temperature gradient specifications for good image quality. The challenge in designing a magnet mount that will thermally isolate the magnet from the floor temperature is that the bottom side of the trailer floor is exposed to outside temperature and wind conditions whose temperature oscillates with changes in weather. If the magnet is not properly isolated from the floor, the magnet temperature and the magnet temperature gradient will change in correspondence to outside temperature. For magnets mounted in fixed site buildings, the floor to which the magnet is mounted has the ground or concrete floor acting as an infinite isolation, hence no thermal isolation system is required for magnet mounting. Without proper thermal design, an MRI magnet mounted to a mobile van floor will have large temperature stratification for extreme outside temperatures.

For this magnet, the heat load paths are through the magnet foot prints and through the mounting bolts. In extreme winter conditions, the outside temperature could be at −29° C. while in summer the outside temperature could easily be at 45° C. The magnet room temperature is always required to be at 22°–26° C. Hence, the temperature gradient between the outside of the van and the inside of the van is approximately 54° C. in a distance normally less than 50.4–76.2 mm (2–3 inches) during the winter.

The materials used in mounting the magnet must have a low thermal conductance in addition to having adequate mechanical strength to support the magnet in static and dynamic conditions. The floor material must also have low moisture absorption to prevent swelling of the floor that will in turn affect magnet and patient table alignment. The objective in area reduction, in accordance with the present invention, is to get as much as possible, but the target is preferably 40% to 50% area reduction. The limiting factor is the mechanical integrity and strength of the pads to support the weight of the magnet after area reduction.

Figure 1A:
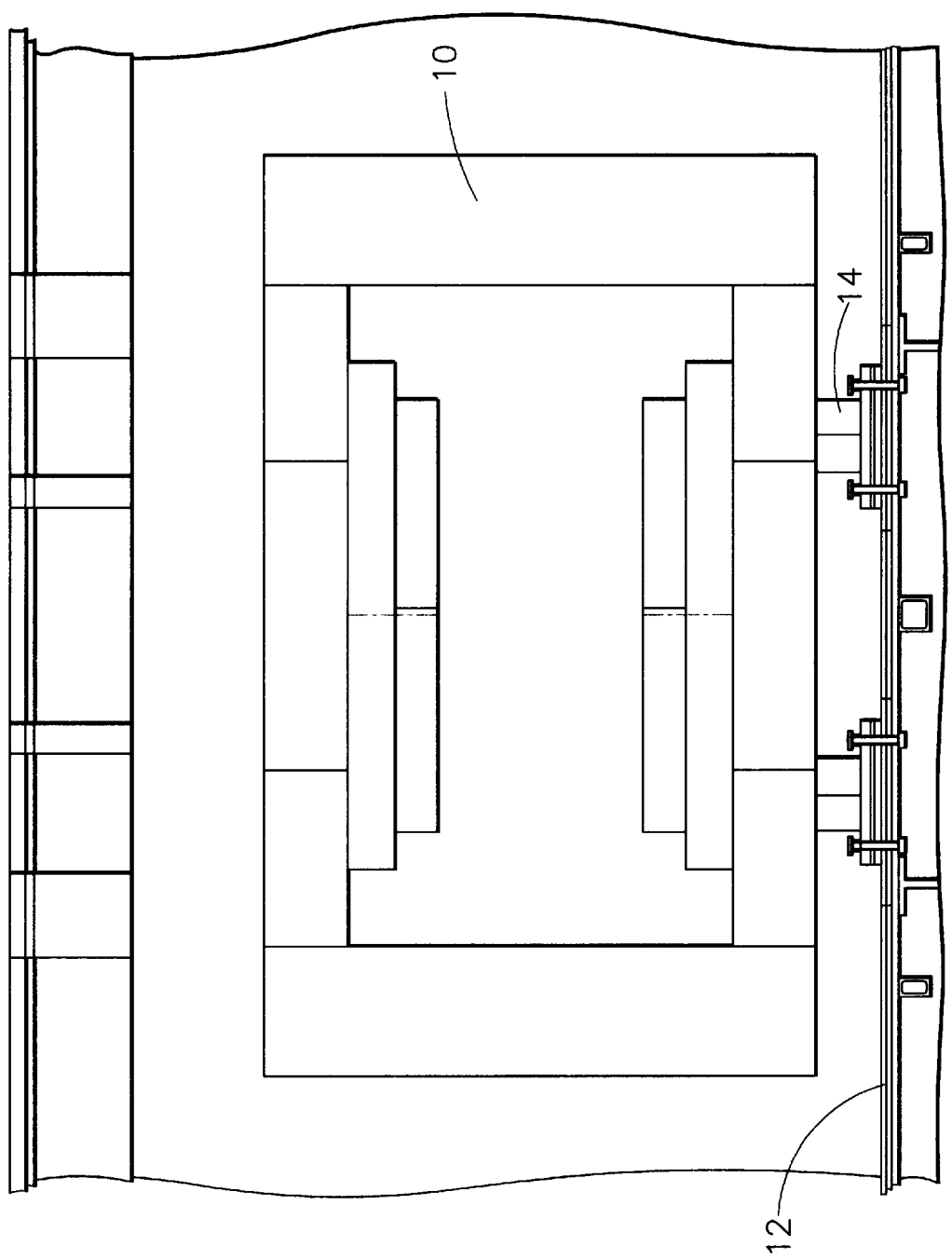
FIGS. 1A and 1B illustrate a thermal and mechanical design for mounting of an MRI permanent magnet in a mobile MRI trailer van.
Figure 1B:
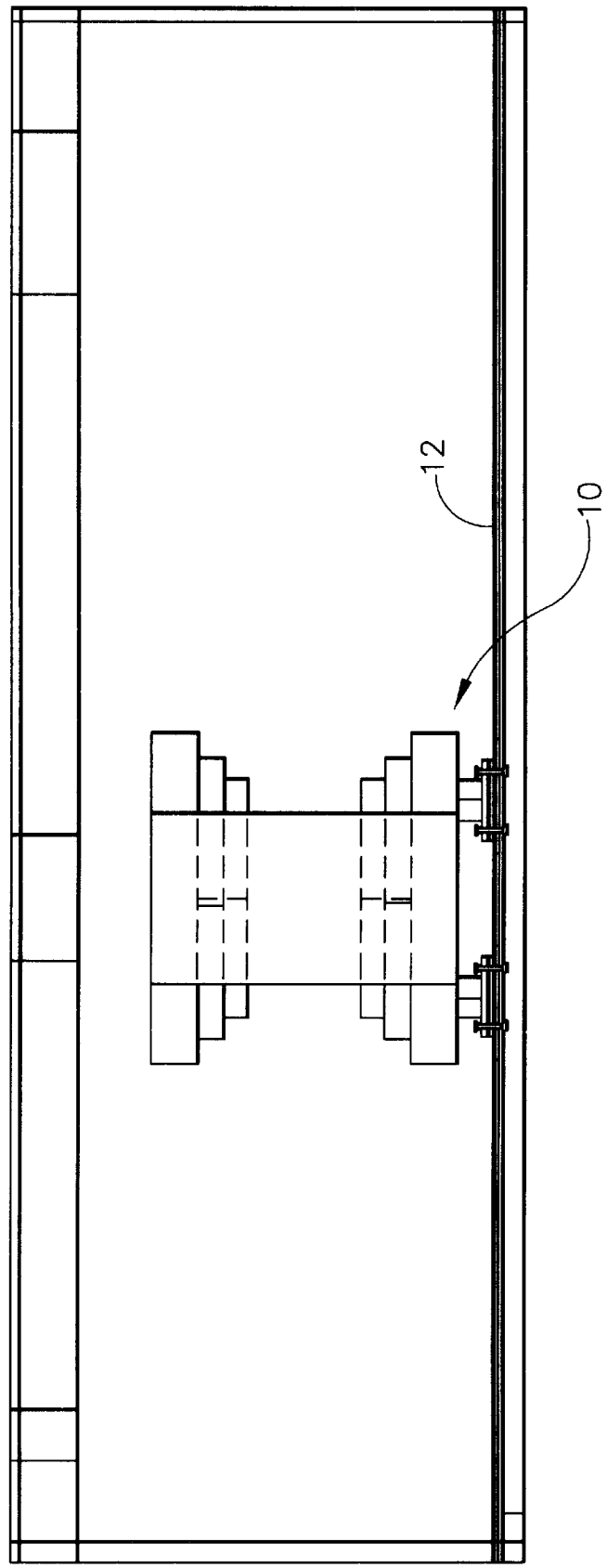
Figure 2:
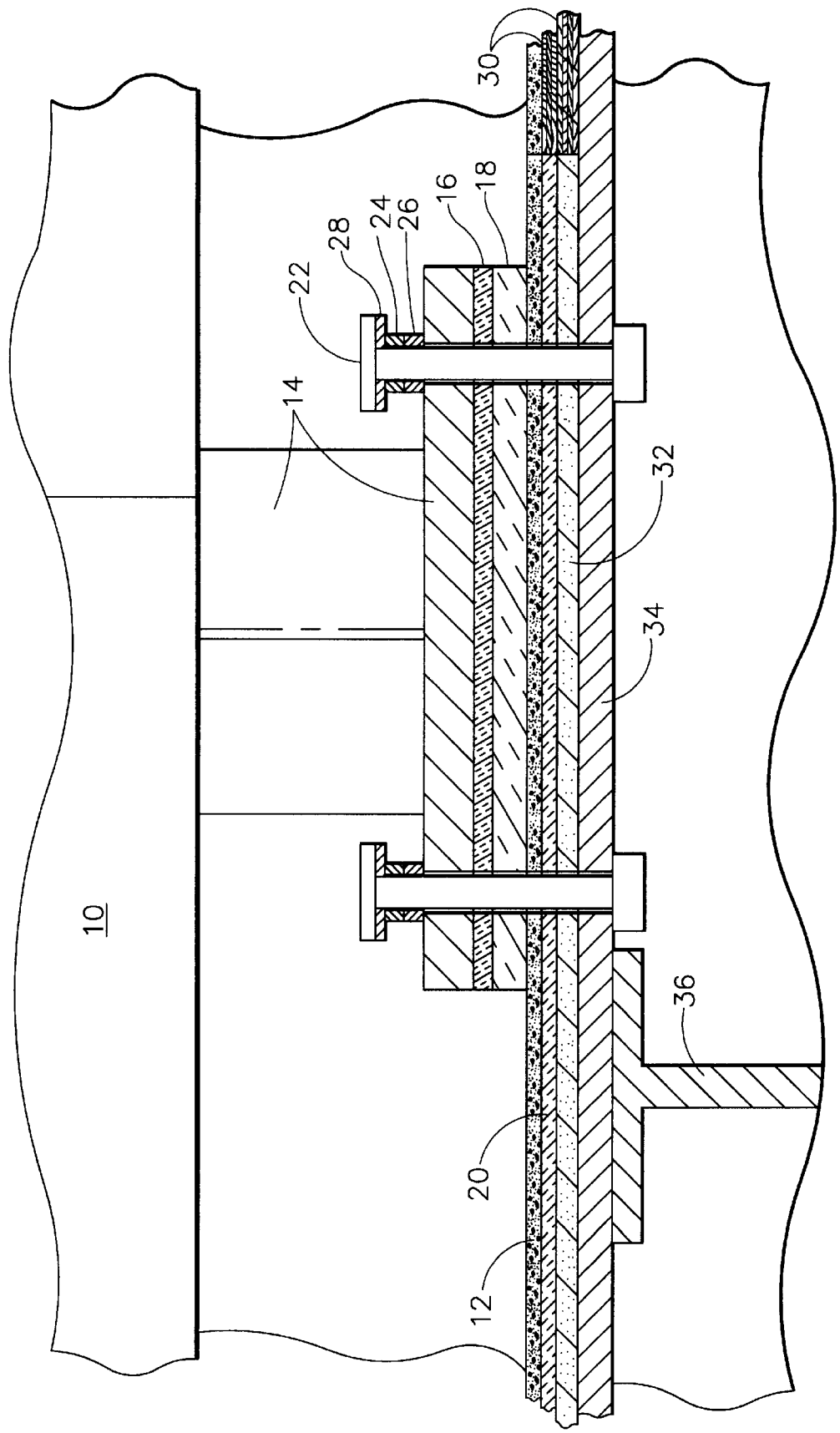
FIG. 2 illustrates the thermal design developed in the mounting scheme for the magnet.

Referring now to the drawings, in FIGS. 1A and 1B, the present invention provides a thermal and mechanical design for mounting of an MRI permanent magnet in a mobile MRI trailer van. The design, illustrated in FIG. 2, shows the thermal design developed in the mounting scheme for the magnet as well as the mechanical connectivity. The mechanical design in accordance with the present invention comprises bolt sizing, torque and stack up to insure that the magnet is adequately connected to the van.

In the drawings, an MRI permanent magnet 10 is mounted on the floor 12 of a trailer van. The magnet feet 14 are insulated from the van floor 12 by a suitable class of industrial laminate or composite insulating materials, such as insulating Phenolic pads 16 and 18. In accordance with the present invention, the thermally isolating material has a conductivity of 0.26 W/m/C or less, and a compressive mechanical strength of at least 50 ksi, where ksi equals one thousand pounds per square inch.

Figure 3A:
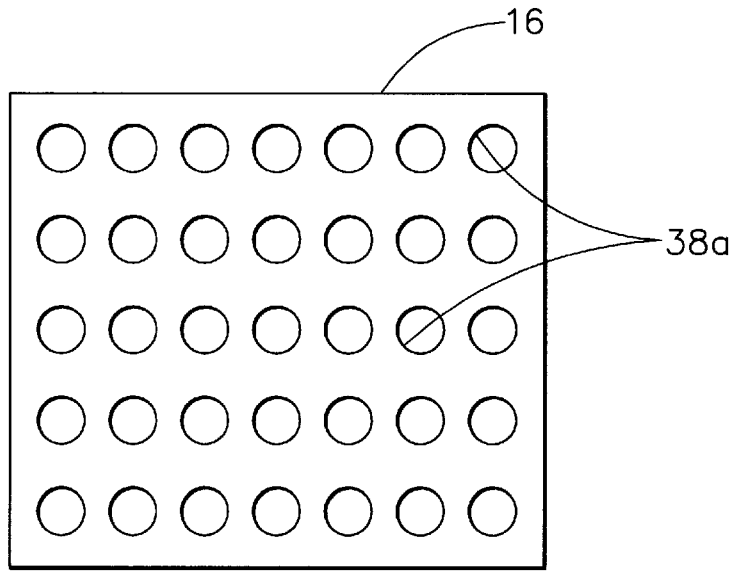
FIG. 3A is a top view of an embodiment of the present invention for increasing thermal resistance of the MRI permanent magnet mounting system.
Figure 3B:
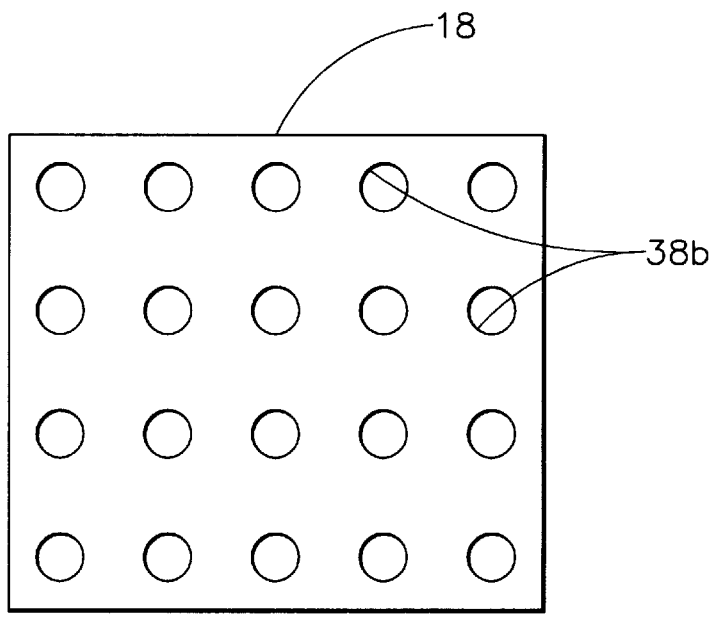
FIG. 3B is a top view of an embodiment which, when applied in conjunction with the embodiment of FIG. 3A, increases the heat conduction path length between the trailer van and the magnet foot.

In a preferred embodiment of the present invention, a stack of two insulating Phenolic pads 16 and 18 are used as the thermally isolating material. The first pad 16 is illustrated in FIG. 3A, and the second pad 18 is illustrated in FIG. 3B. Below the floor tile 12 is another layer of insulating Phenolic 20. The magnet feet 14 are insulated from stainless steel bolts 22 by additional insulating material. In a preferred embodiment, this additional insulating material comprises two stacks of Phenolic G11 washers 24 and 26. A stainless steel washer 28 between the head of bolt 22 and the upper phenolic washer is used to distribute bolt load to prevent cracking of the phenolic washers 24 and 26. In a preferred embodiment, the bolt is torqued to 115 ft-lb load, resulting in a bolt head load of approximately 11,000 lbs.

Continuing with the drawings, as known in the art, additional components comprising a typical trailer floor include plywood 30 for thermal insulation for the rest of the floor 12, magnetic and RF shielding material 32, structural aluminum plate 34, and trailer I-beams 36. For the present invention, it is preferred that the trailer floor 30 in the magnet room be of plywood or a material with equivalent thermal conductivity or less for insulating purposes.

The thermally isolating material 16 and 18 of the present invention, added to the existing trailer floor and structure, provide increased thermal impedance by reducing the effective heat transfer area, as shown in FIGS. 3A and 3B. As can be seen in the drawings, apertures 38 are drilled in the pads 16 and 18 to reduce the effective heat conduction area and increase the thermal resistance. The apertures 38b in FIG. 3B are staggered from the apertures 38a in FIG. 3A so as to increase the heat conduction path length between the van floor to the magnet foot. The number of apertures and size of the apertures is determined to optimize the mechanical strength of the pads, while giving the greatest thermal resistance. The spacing of the apertures is determined such that the apertures in pad 16 do not overlap the apertures in pad 18. This can be seen in the Fourier's heat conduction equation for heat flowing through the pad as:

$$Q = KA\Delta T/dX$$
$$= \Delta T/R$$

where K is the thermal conductivity of the Phenolic G11 pads and $\Delta T$ is the temperature gradient across the pad and dX is the pad thickness and A is the cross sectional area for heat flow. The thermal resistance, R, provided by each pad 16 and 18 is defined as $$R = dX/KA.$$

It can be seen, then, that by lowering the thermal conductivity K, and reducing the area for heat transfer A, the thermal resistance will increase. The aperture patterns in pad 16 are staggered from the aperture patterns in pad 18. This is done to further increase thermal impedance by increasing the conduction path, dX. In order to obtain the maximum area reduction, apertures in pad 16 do not have any overlap of apertures in pad 18.

Different versions for reducing the effective conduction area of the thermally isolating material, or Phenolic pads, 16 and 18 will occur to those skilled in the art, after benefit of reviewing the present invention. Furthermore, the number of pads can vary. In various embodiments, for example, the pad need not have any aperture or cut-away at all, may be solid, or may have various aperture patterns, aperture depth, and aperture sizes applied without departing from the scope of the invention. FIG. 4A shows a rectangular aperture 40 in the approximate center of an alternate embodiment of pad P and FIG. 4B proposes a plurality of rectangular cut-aways 42 on an alternate embodiment of pad P. The number and size of the apertures and/or cut-aways is determined by the mechanical strength of the remaining pad after the apertures and/or cut-aways are made. The remaining pad should have the structural integrity to support the magnet dead weight and dynamic loading during transportation. Again, maximum area reduction is the objective while maintaining structural and mechanical integrity of the pad.

Material that meets the design objects of having thermal conductivity lower than rubber, but high compressive strength to support the large weight of the magnet, and very low water absorption, is Phenolic NEMA grade G11 or similar materials.

The isolation design for the bolting system comprises two layers of thermally insulating material, such as Phenolic washers 24 and 26, and a stainless steel washer 28. The bottom end of the bolt is exposed to the outside air at the bottom underside of trailer van. In winter, a large temperature gradient will exist in the bolt ranging from outside temperature to inside temperature. If the bolt is allowed to contact the magnet feet without proper insulation, this will result in large temperature gradient in the magnet. The Phenolic washers, therefore, can be used to provide the proper thermal impedance between the bolt and the magnet feet.

The major advantage of this invention is that it is passive, effectively reduces the load on the magnet heaters, and forces the temperature gradient into the magnet feet mounting system rather than in the magnet as in prior art.

The invention has been described in detail with particular reference to certain preferred embodiments thereof, but it will be understood that modifications and variations can be effected within the spirit and scope of the invention.

What is claimed is:

1. A method for mounting a permanent magnet in a mobile trailer vehicle, the method comprising the steps of:

providing mounting bolts for mounting the permanent magnet to the mobile trailer vehicle;

providing a first thermally insulating material to thermally insulate the permanent magnet from extreme outside temperatures; and providing a second thermally insulating material to thermally insulate the mounting bolts from the permanent magnet.

2. A method as claimed in claim 1 wherein the step of providing a first thermally insulating material further comprises the step of forcing large temperature gradients on an insulating material.

3. A method as claimed in claim 2 wherein the first thermally insulating material comprises an industrial laminate or composite insulating material.

4. A method as claimed in claim 3 wherein the industrial laminate or composite insulating material comprises at least one insulating Phenolic material.

5. A method as claimed in claim 4 wherein the at least one insulating Phenolic material comprises a plurality of Phenolic pads.

6. A method as claimed in claim 5 wherein the plurality of Phenolic pads are stacked.

7. A method as claimed in claim 6 wherein at least one of the plurality of Phenolic pads comprises a Phenolic pad having an aperture pattern.

8. A method as claimed in claim 7 wherein apertures of an aperture pattern of one Phenolic pad are offset from apertures of an aperture pattern on any other Phenolic pad.

9. A method as claimed in claim 1 wherein the step of providing a second thermally insulating material to thermally insulate the mounting bolts from the permanent magnet further comprises the step of situating at least one laminate or composite insulating material washer to insulate the mounting bolts from the permanent magnet.

10. A mounting system for mounting a permanent magnet in a mobile trailer vehicle, the system comprising:

mounting bolts for mounting the permanent magnet to the floor of the mobile trailer vehicle;

at least one composite insulating material for thermally insulating the permanent magnet from the trailer floor; and at least one composite insulating material for thermally insulating the mounting bolts from the permanent magnet.

* * * * *